(12) United States Patent
Pekny

(10) Patent No.: US 7,064,984 B2
(45) Date of Patent: Jun. 20, 2006

(54) CIRCUIT AND METHOD FOR REDUCING LEAKAGE CURRENT IN A ROW DRIVER CIRCUIT IN A FLASH MEMORY DURING A STANDBY MODE OF OPERATION

(75) Inventor: Theodore T. Pekny, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 666 days.

(21) Appl. No.: 10/052,177

(22) Filed: Jan. 16, 2002

(65) Prior Publication Data

US 2003/0133330 A1 Jul. 17, 2003

(51) Int. Cl.
*G11C 16/08* (2006.01)
(52) U.S. Cl. .......................... 365/185.23; 365/185.18; 365/185.33; 365/230.06; 365/201; 365/229; 365/227
(58) Field of Classification Search ........... 365/230.06, 365/189.05, 201, 229, 228, 227, 185.23, 365/185.18, 185.33
See application file for complete search history.

(56) References Cited

U.S. PATENT DOCUMENTS

| | | | |
|---|---|---|---|
| 4,458,338 A | 7/1984 | Giebel et al. ............... 365/201 |
| 4,514,829 A * | 4/1985 | Chao ..................... 365/230.06 |
| 5,619,450 A | 4/1997 | Takeguchi ............. 365/185.23 |
| 5,638,331 A | 6/1997 | Cha et al. .................... 365/201 |
| 5,699,298 A | 12/1997 | Shiau et al. ........... 365/185.18 |
| 5,970,009 A | 10/1999 | Hoenigschmid et al. .... 365/226 |
| 6,016,281 A * | 1/2000 | Brox ..................... 365/230.06 |
| 6,038,191 A | 3/2000 | Fukuhara et al. ........... 365/229 |
| 6,097,631 A | 8/2000 | Guedj .................... 365/185.18 |
| 6,303,959 B1 | 10/2001 | Ratnam ..................... 257/314 |
| 6,307,236 B1 * | 10/2001 | Matsuzaki et al. .......... 257/392 |
| 6,333,874 B1 * | 12/2001 | Yamauchi .............. 365/189.09 |
| 6,465,835 B1 | 10/2002 | Pham et al. ................ 257/315 |
| 6,525,970 B1 | 2/2003 | Wang et al. ........... 365/185.29 |
| 6,667,900 B1 | 12/2003 | Lowrey et al. ............. 365/171 |
| 2003/0048683 A1 | 3/2003 | Lovett et al. ............... 365/226 |

FOREIGN PATENT DOCUMENTS

| | | | |
|---|---|---|---|
| JP | 09135029 A | * | 5/1997 |
| JP | 2000357962 A | * | 12/2000 |

\* cited by examiner

*Primary Examiner*—Andrew Q. Tran
(74) *Attorney, Agent, or Firm*—Dorsey & Whitney LLP

(57) ABSTRACT

A row driver receives an input signal and a test mode signal, and is coupled to first and second voltage sources and has an output coupled to a word line. The row driver operates in an active mode responsive to the test mode signal going inactive to couple the output to either the first or second voltage source responsive to the input signal. The row driver operates in a standby mode responsive to the test mode signal going active to present a high impedance to the word line. A method includes detecting a first mode of operation of a memory device and floating at least some of the word lines when the first mode is detected. The memory device may be a flash memory device and the first mode may be a standby mode of operation of the flash memory device.

22 Claims, 4 Drawing Sheets

CIRCUIT AND METHOD FOR REDUCING LEAKAGE CURRENT IN A ROW DRIVER CIRCUIT IN A FLASH MEMORY DURING A STANDBY MODE OF OPERATION

TECHNICAL FIELD

The present invention relates generally to integrated circuits, and more specifically to lowering power consumption in integrated circuits during certain modes of operation.

BACKGROUND OF THE INVENTION

Many battery-powered portable electronic devices, such as laptop computers, Portable Digital Assistants, digital cameras, cell phones and the like, require memory devices that provide large storage capacity and low power consumption. One type of memory device that is well-suited to use in such portable devices is flash memory, which is a type of semiconductor memory that provides a relatively large nonvolatile storage capacity for data. The nonvolatile nature of the storage means that the flash memory does not require power to maintain the data, as will be appreciated by those skilled in the art.

A typical flash memory comprises a memory-cell array having an array of memory cells arranged in rows and columns and grouped into blocks. FIG. 1 illustrates a conventional flash memory cell 100 formed by a field effect transistor including a source 102 and drain 104 formed in a substrate 106, with a channel 108 being defined between the source and drain. Each of the memory cells 100 further includes a control gate 110 and a floating gate 112 formed over the channel 108 and isolated from the channel and from each other by isolation layers 114. In the memory-cell array, each memory cell 100 in a given row has its control gate 110 coupled to a corresponding word line WL and each memory cell in a given column has its drain 104 coupled to a corresponding bit line BL. The sources 102 of each memory cell 100 in a given block are coupled together to allow all cells in the block to be simultaneously erased, as will be appreciated by those skilled in the art.

The memory cell 100 is charged or programmed by applying appropriate voltages to the source 102, drain 104, and control gate 110 and thereby injecting electrons e⁻ from the drain 104 and channel 108 through the isolation layer 114 and onto the floating gate 112. Similarly, to erase the memory cell 100, appropriate voltages are applied to the source 102, drain 104, and control gate 110 to remove electrons e⁻ through the isolation layer 114 to the source 102 and channel 108. The presence or absence of charge on the control gate 112 adjusts a threshold voltage of the memory cell 100 and in this way stores data in the memory cell. When charge is stored on the floating gate 112, the memory cell 100 does not turn ON when an access voltage is applied through the word line WL to the control gate 110, and when no charge is stored on the floating gate the cell turns ON in response to the access voltage. In this way, the memory cell 100 stores data having a first logic state when the cell turns ON and a second logic state when the cells does not turn ON.

In a conventional flash memory, a row driver is coupled to each word line WL in the memory-cell array and operates to access memory cells 100 in the corresponding row in response to activation signals. FIG. 2 illustrates a conventional row driver 200 including a PMOS drive transistor 202 and NMOS drive transistor 204 coupled in series, with a supply voltage VX and a first reference voltage VXGND being applied to the sources of the PMOS drive transistor and NMOS drive transistor, respectively. The interconnection of the drains of the transistors 202 and 204 define a node 206 that is coupled to a corresponding word line WL. A second PMOS transistor 208 and NMOS transistor 210 are coupled in series, with the supply voltage VX and a second reference voltage XPDACOM being applied to the sources of the transistors, respectively. The interconnection of the drains of the transistors 208, 210 defines a node 212 that is coupled to the gates of the drive transistors 202 and 204. The transistor 210 receives a first activation signal XPDA and the PMOS transistor 208 receives a second activation signal VXDECEN#. Typically, the first and second reference voltage VXGND and XPDACOM are ground while the supply voltage VX is 5 volts.

In operation, the row driver 200 operates in a select mode to activate memory cells 100 (not shown in FIG. 2) coupled to the word line WL and operates in a deselect mode to turn OFF or deactivate memory cells coupled to the word line, as will now be explained in more detail. In the select mode, the VXDECEN# and XPDA signals are high, turning OFF the PMOS transistor 208 and turning ON the NMOS transistor 210, respectively. The node 212 is driven low through the transistor 210, turning OFF the drive transistor 204 and turning ON the drive transistor 202 which, in turn, drives the word line WL high to approximately the supply voltage VX through the transistor 202. At this point, the memory cells 100 (see FIG. 1) coupled to the word line WL either turn ON or remain OFF, depending on whether a memory cell has been programmed or erased (i.e., depending on the data stored in the cell). In this way, address decode circuitry (not shown) in the flash memory containing the row driver 200 activates the XPDA signal corresponding to the row of memory cells to be accessed. In response to the activated XPDA signal, the corresponding row driver 200 drives the word line WL high to thereby access the memory cells 100 in the corresponding row.

In the deselect mode, the VXDECEN# and XPDA signals are low, turning ON the PMOS transistor 208 and turning OFF the NMOS transistor 201, respectively. The node 212 is driven high through the transistor 208, turning OFF the drive transistor 202 and turning ON the drive transistor 204 which, in turn, drives the word line WL low to approximately ground through the transistor 204. At this point, all the memory cells 100 coupled to the word line WL are turned OFF, regardless of whether a cell has been programmed or erased. Each row driver 200 operates in the deselect mode when the corresponding row of memory cells 100 is not being accessed.

During normal operation of the flash memory, each row driver 200 alternately operates in either the select or deselect mode, depending on whether the corresponding row of memory cells 100 is being accessed or not. The normal mode includes operation of the flash memory during data transfers and when memory cells are being programmed and erased. All the row drivers 200 operate in the deselect mode during a sleep or power-savings mode of operation of the flash memory. As previously mentioned, many battery-powered portable electronic devices utilize flash memory, and to reduce the power consumption and thereby extend the battery life in such devices, the flash memory is typically placed in the power-savings mode when the flash memory is not being used. When in the power-savings mode, the row driver 200 operates as previously described to drive the word line WL low and deactivate all the corresponding memory cells 100.

When a flash memory is operating in the power-savings mode, the memory will at some point be activated to commence data transfer operations in the normal mode. For example, in a portable device the flash memory may be operate in the power-savings mode when the device is turned OFF, and be activated in response to a user turning ON the device. The time required to switch from the power-savings mode to the active mode is ideally minimized so that a user does not experience a delay due to the flash memory changing modes of operation. Thus, the flash memory should be able to begin transferring data to and from the memory cells 100 as soon as possible after termination of the power-savings mode. As a result, during the power-savings mode, a charge pump (not shown) that develops the supply voltage VX continues operating to provide the supply voltage VX to the row drivers 200. In this way, when the power-savings mode is terminated, a selected row driver 200 may activate the corresponding word line WL more quickly than if the driver needed to wait for the charge pump to generate the supply voltage VX having the required magnitude.

Ideally, operation of the charge pump during the power-savings mode consumes no power since all the row drivers 200 are driving the word lines WL low and the PMOS drive transistors 202 are turned OFF, as previously described. More specifically, during the power-savings mode, the VXDECEN# and XPDA signals are low, driving the node 212 high through the transistor 208 and thereby turning OFF the PMOS drive transistor 202. Due to the voltages applied to the source, drain, and gate of the PMOS drive transistor 202, however, a gate induced drain leakage (GIDL) current IGIDL flows through the PMOS drive transistor, as will be appreciated by those skilled in the art. FIG. 3 is a simplified cross-sectional view of the PMOS drive transistor 202 illustrating the IGIDL current through the transistor in this situation. A high electric field is developed in an area 300 where the gate 302 overlaps the drain 304 of the PMOS drive transistor 202. The high electric field is due to the supply voltage VX being applied to the gate 302 and ground being applied to the drain 304 and generates the IGIDL current. The concept of a gate induced drain leakage current is understood by those skilled in the art, and thus, for the sake of brevity, will not be discussed in more detail.

During the power-savings mode, the NMOS drive transistor 204 is turned ON in response to the node 212 (FIG. 2) being driven high through the transistor 208. As a result, the IGIDL current flows through the PMOS drive transistor 202 and through the NMOS drive transistor 204 to ground in each row driver 200. While the IGIDL current through an individual PMOS transistor 202 in a single row driver 200 is small, the summation of the IGIDL currents through all the row drivers may be relatively large, and can cause the charge pump developing the supply voltage VX to consume a significant amount of power during the power-savings mode of operation. The total current consumed by the charge pump will actually be substantially greater than the summation of the leakage currents IGIDL through the row drivers 200 due to operating inefficiencies of the charge pump, as will be appreciated by those skilled in the art.

There is a need for a row driver having a reduced leakage current to lower power consumption during a power-savings mode of operation of a flash memory or other type of memory device containing the row driver.

SUMMARY OF THE INVENTION

According to one aspect of the present invention, a row driver receives an input signal and a test mode signal, and is coupled to first and second voltage sources and has an output coupled to a word line. The row driver operates in an active mode responsive to the test mode signal going inactive to couple the output to either the first or second voltage source responsive to the input signal. The row driver operates in a standby mode responsive to the test mode signal going active to present a high impedance to the word line.

According to another aspect of the present invention, a method of operating a memory device includes detecting a first mode of operation of the memory device. The memory device includes a memory-cell array having a plurality of memory cells arranged in rows and columns, each memory cell in a respective row being coupled to an associated word line. The method further includes floating at least some of the word lines when the first mode is detected. The memory device may be a flash memory device and the first mode may be a standby mode of operation of the flash memory device.

DETAILED DESCRIPTION OF THE INVENTION

Figure 4:
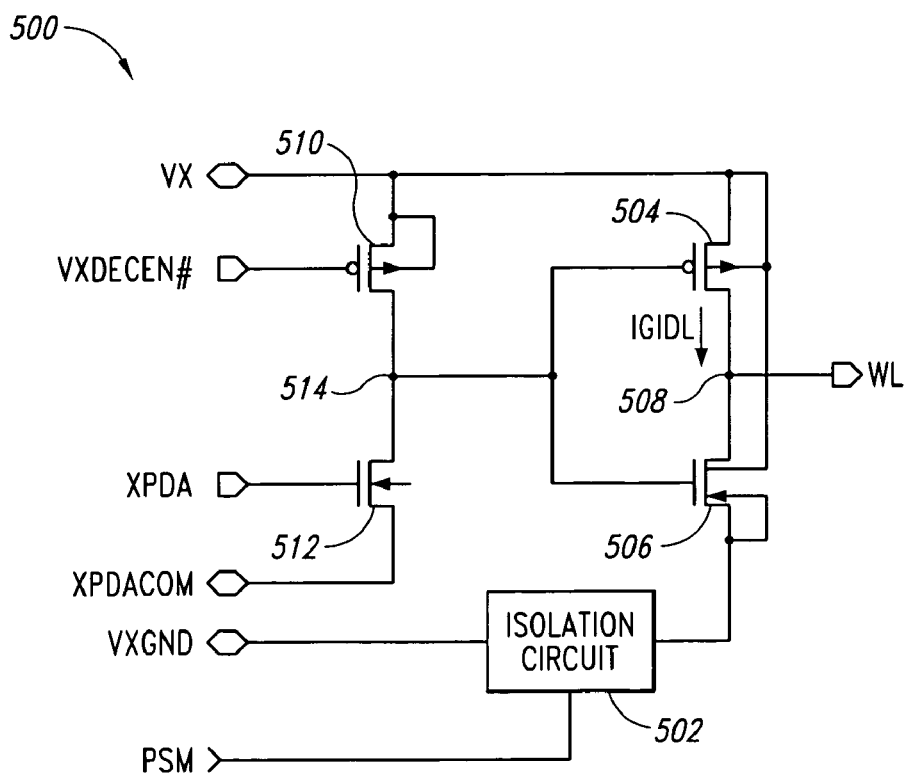
FIG. 4 is a schematic and block diagram illustrating a row driver having a reduced gate induced drain leakage current according to one embodiment of the present invention.

FIG. 4 is a schematic and block diagram illustrating a row driver 500 including an isolation circuit 502 for reducing a gate induced drain leakage current IGIDL of the row driver during a power-savings mode of operation according to one embodiment of the present invention. The isolation circuit 502 receives a power-savings mode signal PSM, and when this signal is active the isolation circuit breaks the current path to ground for the IGIDL current and thereby reduces the leakage current of the row driver 500 to approximately zero, as will be described in more detail below. The row driver 500 includes components 504–514 that are connected and operate in the same way as corresponding components 202–212 in the row driver 200 of FIG. 2. For the sake of brevity, the detailed operation and interconnection of these components 504–514 will not again be described in detail. In the following description, certain details are set forth to provide a sufficient understanding of the present invention, but one skilled in the art will appreciate that the invention may be practiced without these particular details. In other instances below, the operation of well known components have not been shown or described in detail to avoid unnecessarily obscuring the present invention.

In the row driver 500, the isolation circuit 502 is coupled to the source of the NMOS drive transistor 506 and receives the reference voltage VXGND and the PSM signal, which is generated by circuitry (not shown) in the flash memory containing the row driver 500. The PSM signal indicates whether the flash memory is operating in a normal mode or in a power-savings mode. When the PSM signal is inactive, the flash memory is operating in the normal mode and the isolation circuit 502 couples the source of the NMOS drive transistor 506 to the reference voltage VXGND. In the normal mode, the row driver 500 then operates in the same way as previously described for the row driver 200 of FIG. 2. Briefly, in this situation, the row driver 500 couples the word line WL to the supply voltage VX through the transistor 504 when the VXDECEN and XPDA signals are high, and couples the word line to the reference voltage VXGND through the NMOS drive transistor 512 and the isolation circuit 502 when the VXDECEN and XPDA signals are low.

When the PSM signal goes active, the flash memory operates in the power-savings mode and the isolation circuit 502 presents a high impedance on the source of the NMOS drive transistor 506 to thereby isolate the source from ground. In the power-savings mode, the VXDECEN# and XPDA signals are low, driving the node 514 high through the transistor 510 and turning the PMOS drive transistor 504 OFF and the NMOS drive transistor 506 ON as previously discussed during the normal mode. In this situation, the current path of the IGIDL current through the PMOS drive transistor 504 and the NMOS drive transistor 506 to the reference voltage VXGND is "broken" or "opened" by the high impedance the isolation circuit 502 presents at the source of the PMOS drive transistor 506. The high impedance of the isolation circuit 502 thereby isolates or "floats" the source of the NMOS drive transistor 506, preventing the IGIDL current from flowing. In this way, the row driver 500 eliminates the IGIDL current normally associated with a row driver during the power-savings mode of operation. One skilled in the art will understand a variety of different circuits that may be utilized to form the isolation circuit 502, such as a transistor or transmission gate and other suitable circuits.

Figure 1:
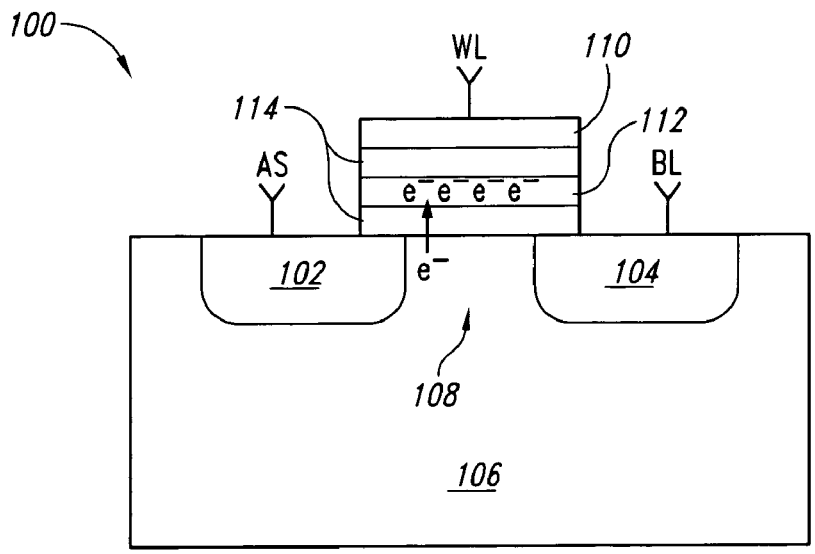
FIG. 1 is a simplified cross-sectional view of a conventional flash memory cell.
Figure 2:
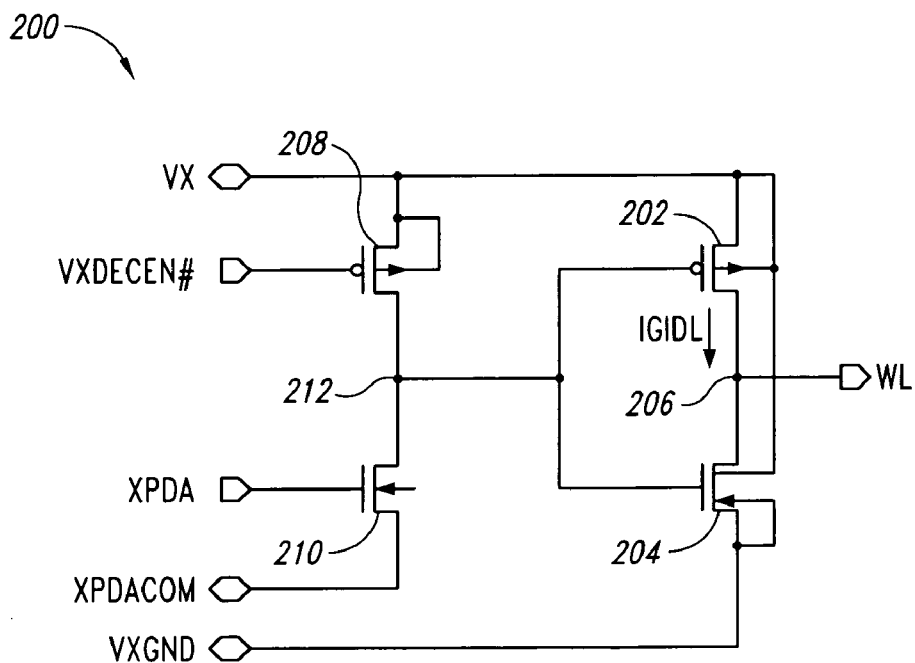
FIG. 2 is a schematic illustrating a conventional row driver for accessing data stored in the memory cell of FIG. 1.
Figure 3:
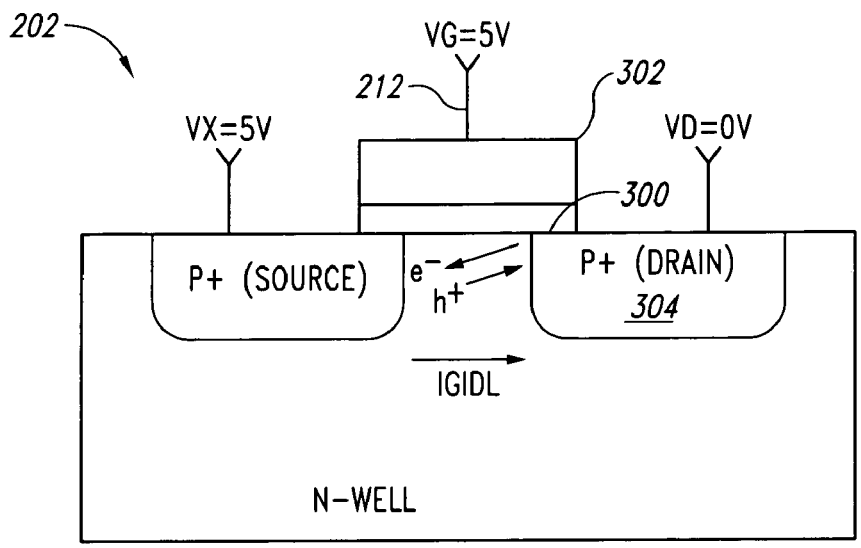
FIG. 3 is a simplified cross-sectional view illustrating a gate induced drain leakage current through the PMOS drive transistor in the row driver of FIG. 2.

In the row driver 500, it should be noted that with the row driver 500 the word line WL is no longer driven to the reference voltage VXGND through the NMOS drive transistor 506 as in the conventional row driver 200 of FIG. 2. In contrast, during the power-savings mode the high impedance of the isolation circuit 502 results in the word line WL being isolated from the reference voltage VXGND. With the conventional row driver 200, the word line WL was driven to ground to turn OFF all memory cells coupled to the word line. The row driver 500, in contrast, takes advantage of the fact that during the power-savings mode the word lines WL need not be driven to ground since none of the memory cells are being accessed. Moreover, the nonvolatile nature of the storage in the flash memory cells allows the word lines WL to float since even if one or more rows of memory cells turns ON, the data stored in those cells will not be lost.

Figure 5:
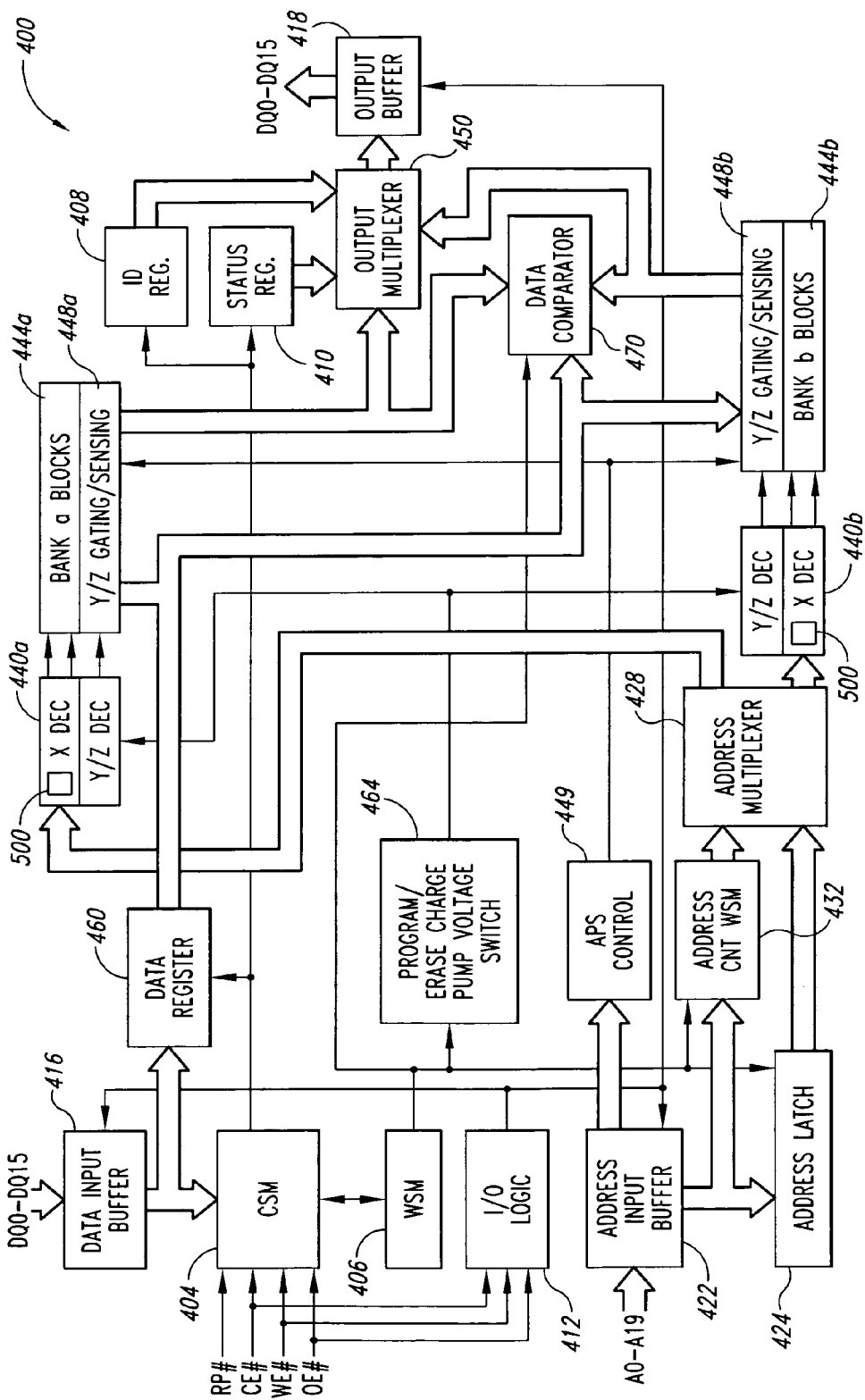
FIG. 5 is a functional block diagram illustrating a flash memory including the row driver of FIG. 4.

FIG. 5 is a functional block diagram of a flash memory 400 including a plurality of row drivers 500 of FIG. 4. The row drivers are shown contained in address decoders 440a, 440b, which will be discussed in more detail below. The flash memory 400 includes a command state machine (CSM) 404 that receives control signals including a reset/power-down signal RP#, a chip enable signal CE#, a write enable signal WE#, and an output enable signal OE#, where the "#" denotes a signal as being low true. An external processor (not shown) applies command codes on a data bus DQ0–DQ15 and these command codes are applied through a data input buffer 416 to the CSM 404. A command being applied to the flash memory 400 includes the control signals RP#, CE#, WE#, and OE# in combination with the command codes applied on the data bus DQ0–DQ15. The CSM 404 decodes the commands and acts as an interface between the external processor and an internal write state machine (WSM) 408. When a specific command is issued to the CSM 404, internal command signals are provided to the WSM 408, which in turn, executes the appropriate process to generate the necessary timing signals to control the memory device 400 internally and accomplish the requested operation. The CSM 404 also provides the internal command signals to an ID register 408 and a status register 410, which allows the progress of various operations to be monitored when interrogated by issuing to the CSM 404 the appropriate command.

In response to the RP# and/or CE# signals, the CSM 404 develops the PSM signal to control the mode of operation of the row drivers 500. In one embodiment, when the CE# signal is active low, the CSM 404 deactivates the PSM signal, placing the row drivers 500 in the normal mode of operation. When the CE# signal is inactive high, the CSM 404 activates the PSM signal and thereby places the row drivers 500 in the power-savings mode of operation.

The CE#, WE#, and OE# signals are also provided to input/output (I/O) logic 412 which, in response to these signals indicating a read or write command, enables a data input buffer 416 and an data output buffer 418, respectively. The I/O logic 412 also provides signals to an address input buffer 422 in order for address signals to be latched by an address latch 424. The latched address signals are in turn provided by the address latch 424 to an address multiplexer 428 under the command of the WSM 406. The address multiplexer 428 selects between the address signals provided by the address latch 424 and those provided by an address counter 432. The address signals provided by the address multiplexer 428 are used by the address decoders 440a, 440b to access the memory cells of memory banks 444a, 444b that correspond to the address signals. Based on the decoded address, row activation signals are provided to the appropriate row drivers 500 to drive the respective word line for accessing the memory cells. A gating/sensing circuit 448a, 448b is coupled to each memory bank 444a, 444b for the purpose of programming and erase operations, as well as for read operations. An automatic power saving (APS) control circuit 449 receives address signals from the address input buffer 422 and also monitors the control signals RP#, CE#, OE#, and WE#. When none of these lines toggle within a time-out period, the APS control circuit 449 generates control signals to place the gating/sensing circuits 448a, 448b in a power-saving mode of operation.

During a read operation, data is sensed by the gating/sensing circuit 448a, 448b and amplified to sufficient voltage levels before being provided to an output multiplexer 450. The read operation is completed when the WSM 406 instructs an output buffer 418 to latch data provided from the output multiplexer 450 to be provided to the external processor. The output multiplexer 450 can also select data from the ID and status registers 408, 410 to be provided to the output buffer 418 when instructed to do so by the WSM 406. During a program or erase operation, the I/O logic 412 commands the data input buffer 416 to provide the data signals to a data register 460 to be latched. The WSM 406 also issues commands to program/erase circuitry 464 which uses the address decoder 440 to carry out the process of injecting or removing electrons from the memory cells of the memory banks 444a, 444b to store the data provided by the data register 460 to the gating sensing circuit 448. To ensure that sufficient programming or erasing has been performed, a data comparator 470 is instructed by the WSM 406 to compare or verify the state of the programmed or erased memory cells to the data latched by the data register 460. During all of these modes of operation the CSM 404 maintains the PSM signal inactive so that the row drivers 500 operate in the normal mode as previously described.

The flash memory 400 operates in a standby mode power-savings when the RP# and CE# signals are both high, and operates in a reset deep power-down mode when the RP# signal goes active low. As previously mentioned, in one embodiment, in response to the RP# and CE# signals going inactive high to place the memory 400 in the standby mode, the CSM 404 drives the PSM signal active, placing the row drivers 500 in the power-savings mode of operation and thereby reducing the power consumed by the flash memory in the standby mode.

It will be appreciated that the embodiment of the flash memory 400 illustrated in FIG. 5 has been provided by way of example and that the present invention is not limited thereto. Those of ordinary skill in the art have sufficient understanding to modify the previously described flash memory embodiment to implement other embodiments of the present invention. For example, although the row drivers 500 are shown as being contained in the decoders 440a, 440b in FIG. 6, the row drivers may be incorporated into one of the other circuit blocks, or alternatively, may be split among several circuit blocks. The particular arrangement of the row drivers 500 within a memory device will be a matter of design preference. Moreover, the CSM 404 may also activate the PSM signal in response to other operating modes of the flash memory 400, such when the RP# signal goes active low to place the flash memory in the reset deep-power down mode of operation. The row driver 500 may also be used in other types of integrated circuits containing flash memory, and also may be used in other types of memory where word lines may be floated during certain modes of operation to realize power savings during such modes of operation.

Figure 6:
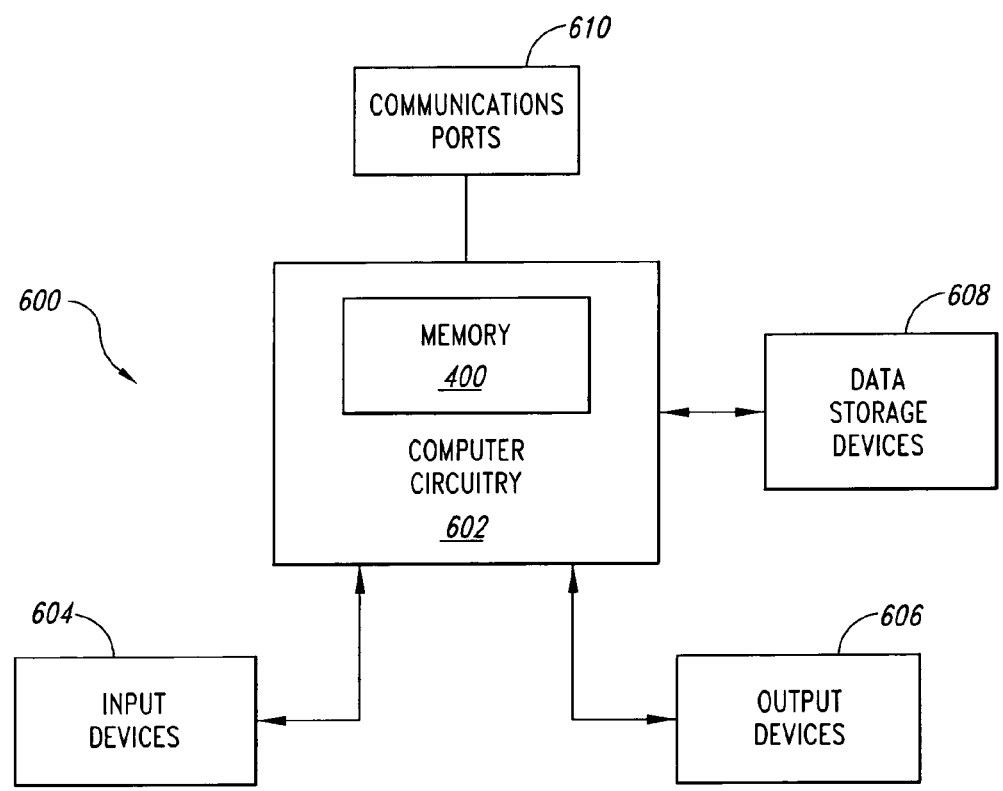
FIG. 6 is a functional block diagram illustrating a computer system including the flash memory of FIG. 5.

FIG. 6 is a block diagram of a computer system 600 including computer circuitry 602 that contains the flash memory 400 of FIG. 6. The computer circuitry 602 performs various computing functions, such as executing specific software to perform specific calculations or tasks. In addition, the computer system 600 includes one or more input devices 604, such as a keyboard or a mouse, coupled to the computer circuitry 602 to allow an operator to interface with the computer system. Typically, the computer system 600 also includes one or more output devices 606 coupled to the computer circuitry 602, such output devices typically being a printer or video display. One or more data storage devices 608 are also typically coupled to the computer circuitry 602 to store data or retrieve data from external storage media (not shown). Examples of typical storage devices 608 include hard and floppy disks, tape cassettes, compact disc read-only memories (CD-ROMs), read-write CD ROMS (CD-RW), and digital video discs (DVDs). The computer system 610 also typically includes communications ports 610 such as a universal serial bus (USB) and/or an IEEE-1394 bus to provide for communications with other devices, such as desktop personal computers, a digital cameras, and digital camcorders. The computer circuitry 602 is typically coupled to the flash memory 400 through appropriate address, data, and control busses to provide for writing data to and reading data from the flash memory.

Even though various embodiments and advantages of the present invention have been set forth in the foregoing description, the above disclosure is illustrative only, and changes may be made in detail and yet remain within the broad aspects of the invention. Therefore, the present invention is to be limited only by the appended claims.

The invention claimed is:

1. A row driver comprising a circuit adapted to receive an input signal and a test mode signal, and adapted to be coupled to first and second voltage sources and having an output adapted to be coupled to a word line, the circuit operable in an active mode responsive to the test mode signal going inactive to couple the output to either the first or second voltage source responsive to the input signal, and being operable in a standby mode responsive to the test mode signal going active to present a high impedance to the word line.

2. The row driver of claim 1 wherein the first voltage source comprises a supply voltage source and the second voltage source comprises a reference voltage source.

3. The row driver of claim 1 wherein the test mode signal goes active during a standby mode of operation and goes inactive during a normal operating mode during which memory cells coupled to the word line may be accessed.

4. The row driver of claim 1 further comprising:
a first output circuit having a first terminal adapted to receive a supply voltage, a second terminal coupled to an output node, and a control terminal adapted to receive an input signal, the first output circuit being operable to couple the first terminal to the second terminal responsive to the input signal having a first logic state, and operable to isolate the first and second terminals responsive to the input signal having a second logic state;
a second output circuit having a first terminal, a second terminal coupled to the output node, and a control terminal adapted to receive the input signal, the second output circuit being operable to couple the first terminal to the second terminals responsive to the input signal having the second logic state, and operable to isolate the first and second terminals responsive to the input signal having the first logic state; and
an isolation circuit adapted to receive a reference voltage and coupled to the first terminal of the second output circuit, and adapted to receive a test mode signal, the isolation circuit operable responsive to the test mode signal being inactive to apply the reference voltage on the first terminal of the second output circuit, and operable responsive to the test mode signal being active to present a high impedance to the first terminal of the second output circuit.

5. The row driver of claim 4 wherein the first output circuit comprises a PMOS transistor and the second output circuit comprises an NMOS transistor.

6. The row driver of claim 4 wherein the isolation circuit comprises a transistor.

7. A row driver, comprising:
a PMOS transistor having a source adapted to receive a supply voltage, a gate adapted to receive an input signal, and a drain adapted to be coupled to a word line;
an NMOS transistor having a drain coupled to the drain of the PMOS transistor, a source, and a gate coupled to the gate of the PMOS transistor;
an isolation circuit coupled to the source of the NMOS transistor and adapted to receive a reference voltage and a test mode signal, the isolation circuit coupling the source of the NMOS transistor to the reference voltage responsive to the test mode signal going inactive and presenting a high impedance at the source of the NMOS transistor responsive to the test mode signal going active.

8. The row driver of claim 7 wherein the test mode signal goes active during a standby mode of operation and goes inactive during a normal operating mode during which memory cells coupled to the word line may be accessed.

9. The row driver of claim 7 wherein the reference voltage comprises ground.

10. The row driver of claim 7 wherein the isolation circuit comprises a transistor.

11. A row driver including a PMOS transistor coupled between a supply voltage source and an output node, and including an NMOS transistor coupled between the output node and a reference node, the gates of the transistors being adapted to receive an input signal and the output node being coupled to a word line, and the row driver including an isolation circuit coupled to the reference node and adapted to receive a test mode signal and a reference voltage, the isolation circuit operable in a first mode responsive to the test mode signal going inactive to apply the reference voltage on the reference node and the PMOS and NMOS transistors being operable during the first mode to couple the word line to either the supply voltage or the reference voltage in response to the input signal, and the isolation circuit operable in a second mode responsive to the test mode signal going active to isolate the reference node, the PMOS transistor being deactivated during the second mode and the NMOS transistor being activated to couple the word line to the isolated reference node, the isolated reference node reducing any gate induced leakage current through the PMOS transistor during the second mode.

12. The row driver of claim 11 wherein the test mode signal goes active during a standby mode of operation and goes inactive during a normal operating mode during which memory cells coupled to the word line may be accessed.

13. The row driver of claim 11 wherein the reference voltage comprises ground.

14. A row driver, comprising:
a first coupling means having a first terminal adapted to receive a supply voltage, a second terminal coupled to an output node adapted to be coupled to a word line, and a control terminal adapted to receive an input signal for coupling or isolating the first and second terminals responsive to the input signal;
a second coupling means having a first terminal, a second terminal coupled to the output node, and a control terminal adapted to receive the input signal for coupling or isolating the first and second signal terminals responsive to the input signal; and
an isolation means adapted to receive the reference voltage and coupled to the first terminal of the second coupling means, and adapted to receive a test mode signal for applying the reference voltage on the first terminal of the second coupling means when the test mode signal goes inactive and for presenting a high impedance on the first terminal of the second coupling means when the test mode signal goes active.

15. The row driver of claim 14 wherein the test mode signal goes active during a standby mode and goes inactive during a normal operating mode during which memory cells coupled to the word line may be accessed.

16. The row driver of claim 14 wherein the reference voltage comprises ground voltage.

17. A memory device, comprising:
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit; the memory-cell array including a plurality of word lines; and
a plurality of row drivers, each row driver coupled to an associated word line in the memory-cell array and coupled to the address decoder to receive a row activation signal, and the row driver being coupled to the control circuit to receive a test mode signal, each row driver being operable in an active mode responsive to the test mode signal going inactive to couple the associated word line to either a first or a second voltage source responsive to the corresponding row activation signal, and being operable in a standby mode responsive to the test mode signal going active to present a high impedance to the corresponding word line.

18. The memory device of claim 17 wherein the first voltage source comprises a supply voltage source and the second voltage source comprises a reference voltage source.

19. The memory device of claim 17 wherein the memory device comprises a flash memory and wherein the test mode signal goes active during a standby mode of operation and goes inactive during a normal operating mode during which memory cells coupled to an addressed word line may be accessed.

20. A computer system, comprising:
a data input device;
a data output device;
a processor coupled to the data input and output devices; and
a memory device coupled to the processor, the memory device comprising,
an address bus;
a control bus;
a data bus;
an address decoder coupled to the address bus;
a read/write circuit coupled to the data bus;
a control circuit coupled to the control bus;
a memory-cell array coupled to the address decoder, control circuit, and read/write circuit; the memory-cell array including a plurality of word lines; and
a plurality of row drivers, each row driver coupled to an associated word line in the memory-cell array and coupled to the address decoder to receive a row activation signal, and the row driver being coupled to the control circuit to receive a test mode signal, each row driver being operable in an active mode responsive to the test mode signal going inactive to couple the associated word line to either a first or a second voltage source responsive to the corresponding row activation signal, and being operable in a standby mode responsive to the test mode signal going active to present a high impedance to the corresponding word line.

21. The computer system of claim 20 wherein the first voltage source comprises a supply voltage source and the second voltage source comprises a reference voltage source.

22. The computer system of claim 20 wherein the memory device comprises a flash memory and wherein the test mode signal goes active during a standby mode of operation and goes inactive during a normal operating mode during which memory cells coupled to an addressed word line may be accessed.

* * * * *